(12) United States Patent
Nikipelov et al.

(10) Patent No.: US 10,468,225 B2
(45) Date of Patent: Nov. 5, 2019

(54) ELECTRON SOURCE FOR A FREE ELECTRON LASER

(71) Applicant: ASML Netherlands B.V., Veldhoven (NL)

(72) Inventors: Andrey Alexandrovich Nikipelov, Eindhoven (NL); Gerrit Jacobus Hendrik Brussaard, Boxtel (NL); Wouter Joep Engelen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/072,385

(22) PCT Filed: Feb. 7, 2017

(86) PCT No.: PCT/EP2017/052620
§ 371 (c)(1),
(2) Date: Jul. 24, 2018

(87) PCT Pub. No.: WO2017/153104
PCT Pub. Date: Sep. 14, 2017

(65) Prior Publication Data
US 2019/0035594 A1    Jan. 31, 2019

(30) Foreign Application Priority Data

Mar. 7, 2016 (EP) .................................. 16158928

(51) Int. Cl.
*H01J 37/073* (2006.01)
*H01S 3/09* (2006.01)
*H05H 7/08* (2006.01)

(52) U.S. Cl.
CPC .......... *H01J 37/073* (2013.01); *H01S 3/0903* (2013.01); *H01J 2237/063* (2013.01); *H05H 2007/084* (2013.01)

(58) Field of Classification Search
CPC . H01J 37/073; H01J 2237/063; H01S 3/0903; H05H 7/08; H05H 2007/081; H05H 2007/084
See application file for complete search history.

(56) References Cited

U.S. PATENT DOCUMENTS 4,703,228 A * 10/1987 West ...................... H01J 3/021
                                                      315/149
6,285,690 B1 * 9/2001 Kim ...................... H01S 3/0903
                                                      359/335

(Continued)

FOREIGN PATENT DOCUMENTS

JP         H07-37514 A        2/1995
WO     WO-2015135912 A2 *  9/2015 ......... G03F 7/70008

OTHER PUBLICATIONS

Oudheusden et al., "Compression of sub-relativistic space-charge-dominated electron bunches for single-shot femtosecond electron diffraction," Physical Review Letters, vol. 105, No. 264801, Dec. 31, 2010; pp. 1-4.

(Continued)

*Primary Examiner* — David E Smith
(74) *Attorney, Agent, or Firm* — Sterne, Kessler, Goldstein & Fox P.L.L.C.

(57) ABSTRACT

An electron source, e.g. for a free electron laser used for EUV lithography comprises: • a cathode (203) configured to be connected to a negative potential (100, 101); • a laser (110) configured to direct pulses of radiation onto the cathode so as to cause the cathode to emit bunches of electrons; • an RF booster (180) connected to an RF source and configured to accelerate the bunches of electrons; and • a timing corrector (303, 313, 400, 401) configured to correct the time of arrival of bunches of electrons at the RF booster relative to the RF voltage provided by the RF source. The timing corrector may comprise a correction electrode (303, (Continued)

313) surrounding a path of the bunches of electrons from the cathode to the RF booster and a correction voltage source (400, 401) configured to apply a correction voltage to the correction electrode.

17 Claims, 6 Drawing Sheets

(56) References Cited

U.S. PATENT DOCUMENTS

| | | | |
|---|---|---|---|
| 9,728,931 B2* | 8/2017 | Nikipelov | H01J 1/34 |
| 2003/0026300 A1* | 2/2003 | Biedron | H01S 3/0959 |
| | | | 372/2 |
| 2008/0129203 A1* | 6/2008 | Agustsson | H01J 23/005 |
| | | | 315/5 |

OTHER PUBLICATIONS

Bazarov I.V., Ivan V. Bazarov: Research, Cornell University, available at http://www.lns.cornell.edu/~ib38/research.html, Nov. 15, 2015; 6 pages.

Schmidt et al., "Feedback Strategies for Bunch Arrival Time Stabilization at Flash Towards 10 fs," Proceedings of the 33$^{rd}$ International Free Electron Laser Conference, Aug. 22-26, 2011; pp. 531-534.

Bock et al., "Recent Developments of the Bunch Arrival Time Monitor with Femtosecond Resolution at Flash," Proceedings of the 1$^{st}$ International Particle Accelerator Conference, May 23-28, 2010; pp. 2405-2407.

Smolenski et al., "Design and Performance of the Cornell ERL DC Photoemission Gun," 18$^{th}$ International Spin Physics Symposium, American Institute of Physics, Aug. 2009; pp. 1077-1083.

Paraliev et al., "Status of 500kV Low Emittance Electron Gun Test Facility for a Compact X-ray Free Electron Laser at Paul Scherrer Institute," IEEE International Power Modulators and High-Foltage Conference, May 27-31, 2008; pp. 532-535.

Goa et al., "Ultrabright femtosecond electron sources: perspectives and challenges towards the study of structural dynamics in labile systems," Ultrafast Nonlinear Imaging and Spectroscopy II, Proceedings of SPIE, vol. 9198, 2014; pp. 1-7.

International Search Report and Written Opinion of the International Searching Authority directed to related International Patent Application No. PCT/EP2017/052620, dated May 10, 2017; 13 pages.

\* cited by examiner

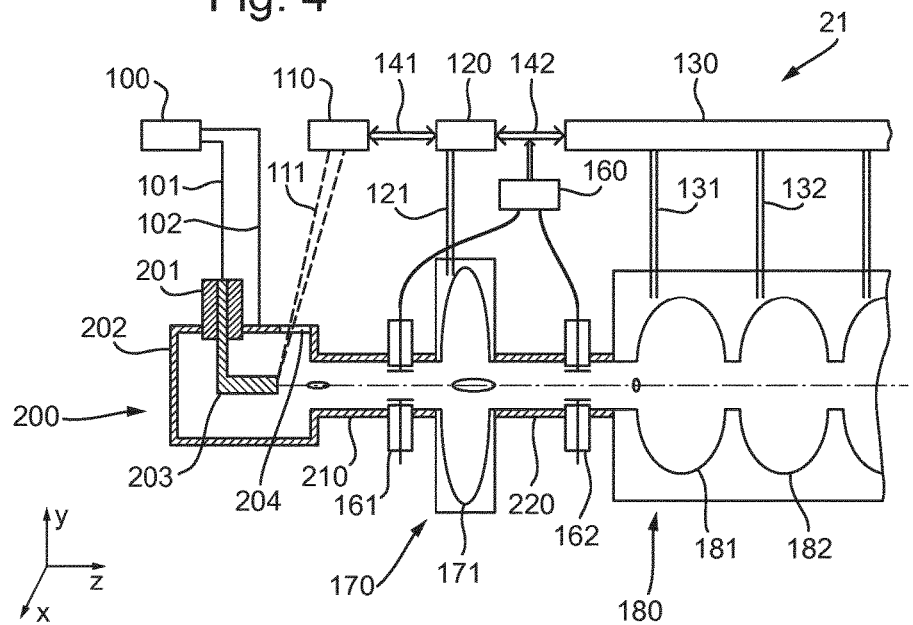
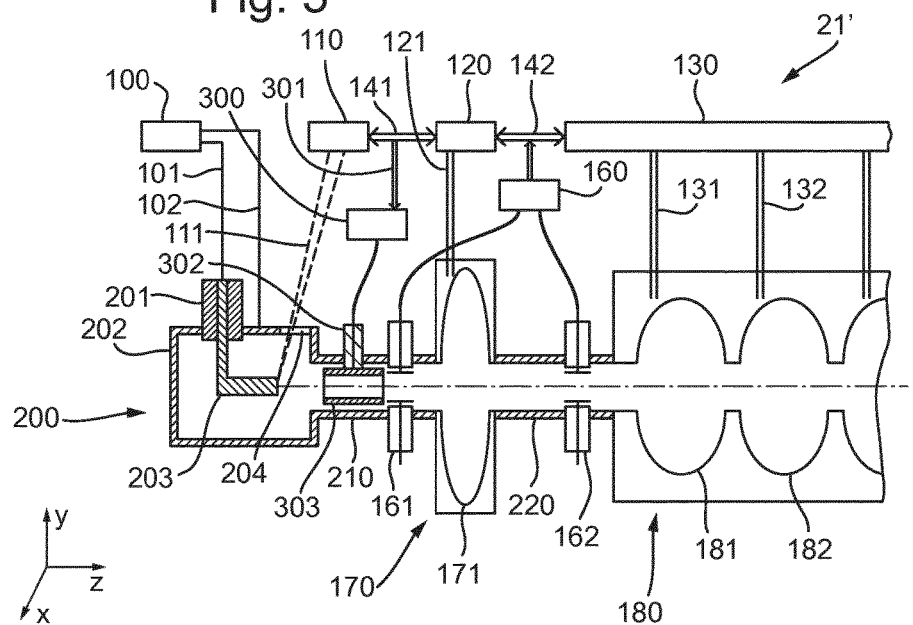

ELECTRON SOURCE FOR A FREE ELECTRON LASER

CROSS-REFERENCE TO RELATED APPLICATIONS

This application claims priority of EP application 16158928.8 which was filed on Mar. 7, 2016 and which is incorporated herein in its entirety by reference.

FIELD

The present invention relates to an electron source, in particular for a free electron laser (FEL). Particularly, but not exclusively, the present invention relates to a FEL suitable for use in a radiation source for a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

It is desirable to produce EUV radiation sources with increased power at the desired wavelength to increase throughput of EUV lithography.

SUMMARY

According to a first aspect, there is provided an electron source comprising:

a cathode configured to be connected to a negative potential;

a laser configured to direct pulses of radiation onto the cathode so as to cause the cathode to emit bunches of electrons;

an RF booster connected to an RF source and configured to accelerate the bunches of electrons; and a timing corrector configured to correct the time of arrival of bunches of electrons at the RF booster relative to the RF voltage provided by the RF source.

According to a further aspect, there is provided a free electron laser comprising an electron source as described above.

According to a further aspect, there is provided a lithographic system comprising:

a free electron laser as described above; and
one or more lithographic apparatuses.

According to a further aspect, there is provided a method of producing a radiation beam, comprising:

directing pulses of radiation at a cathode so as to cause the cathode to emit bunches of electrons;

accelerating the bunches of electrons using an RF booster connected to an RF source;

correcting the time of arrival of bunches of electrons at the RF booster relative to the phase of the RF voltage.

In this way, the proportion of the output radiation of the free electron laser that is within the desired wavelength band can be increased.

BRIEF DESCRIPTION OF THE DRAWINGS

Embodiments of the invention will now be described, by way of example only, with reference to the accompanying schematic drawings, in which:

FIG. 4 depicts a conventional injector subsystem of a free electron laser;

FIG. 5 depicts an injector subsystem of a free electron laser according to an embodiment;

DETAILED DESCRIPTION

Figure 1:
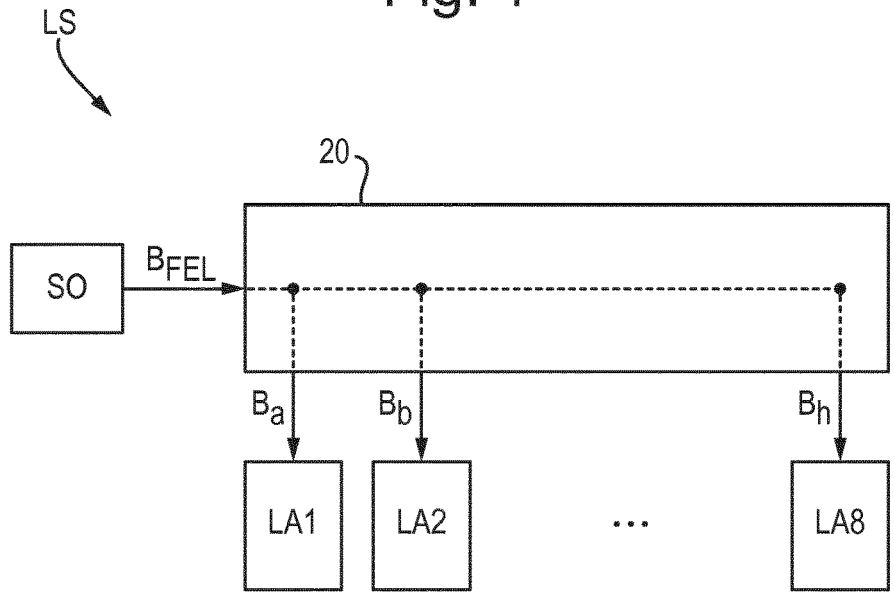
FIG. 1 depicts a lithographic system comprising a free electron laser according to an embodiment of the invention.

FIG. 1 shows a lithographic system LS, comprising: a radiation source SO, a beam splitting apparatus 20 and eight lithographic apparatuses LA1-LA8. The radiation source SO comprises a free electron laser and is configured to generate an extreme ultraviolet (EUV) radiation beam $B_{FEL}$ (which may be referred to as a main beam). The main radiation beam $B_{FEL}$ is split into a plurality of radiation beams $B_a$-$B_h$ (which may be referred to as branch beams), each of which is directed to a different one of the lithographic apparatuses LA1-LA8, by the beam splitting apparatus 20. The branch radiation beams $B_a$-$B_h$ may be split off from the main radiation beam in series, with each branch radiation beam being split off from the main radiation beam downstream from the preceding branch radiation beam. Where this is the case the branch radiation beams may for example propagate substantially parallel to each other.

The radiation source SO, beam splitting apparatus 20 and lithographic apparatuses LA1-LA8 may all be constructed and arranged such that they can be isolated from the external environment. A vacuum may be provided in at least part of the radiation source SO, beam splitting apparatus 20 and lithographic apparatuses LA1-LA8 so as to minimise the absorption of EUV radiation. Different parts of the lithographic system LS may be provided with vacuums at different pressures (i.e. held at different pressures which are below atmospheric pressure).

Figure 2:
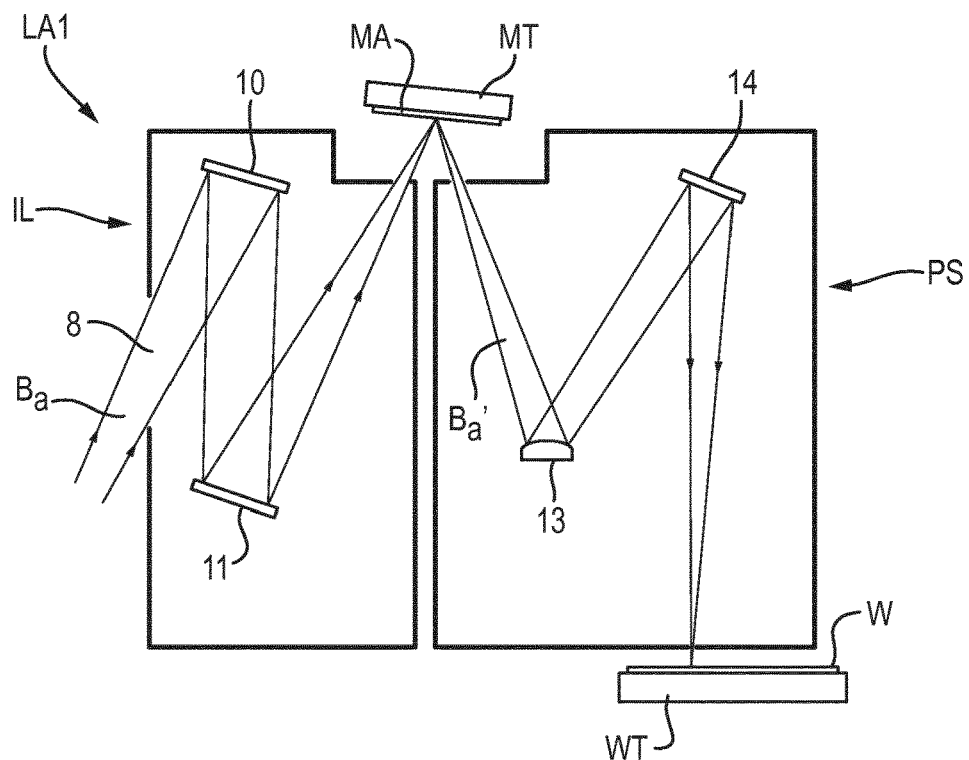
FIG. 2 depicts a lithographic apparatus that forms part of the lithographic system of FIG. 1.

Referring to FIG. 2, a lithographic apparatus LA1 comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus LA1 before it is incident upon the patterning device MA. The projection system is configured to project the radiation beam $B_a'$ (now patterned by the mask MA) onto the substrate W. The substrate W may include previously formed patterns. Where this is the case, the lithographic apparatus LA1 aligns the patterned radiation beam $B_a'$ with a pattern previously formed on the substrate W.

While only lithographic apparatuses are shown in FIG. 2, it is to be understood that the lithographic system LS may comprise other tools, such as mask inspection apparatuses.

The branch radiation beam $B_a$ that is received by the lithographic apparatus LA1 passes into the illumination system IL from the beam splitting apparatus 20 through an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The faceted field mirror device 10 and faceted pupil mirror device 11 may each comprise an array of independently movable mirrors. The faceted field mirror device 10 and faceted pupil mirror device 11 may comprise different numbers of independently movable mirrors. For example the faceted pupil mirror device 11 may comprise twice as many mirrors as the faceted field mirror device 10. The mirrors in the faceted field mirror device 10 and faceted pupil mirror device 11 may be of any suitable shape, for example, they may be generally banana-shaped. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be MEMS devices.

Following reflection from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The radiation source SO comprises a free electron laser FEL according to an embodiment of the present invention, which is operable to produce a beam of EUV radiation. Optionally, the radiation source SO may comprise more than one free electron laser FEL according to an embodiment of the present invention.

The radiation source SO may further comprise optics arranged to alter the size and/or shape of the cross section of the radiation beams received from the free electron laser.

The optics may comprise beam expanding optics arranged to increase the cross sectional area of the radiation beam output by that free electron laser. Advantageously, this decreases the heat load on mirrors downstream of the beam expanding optics. This may allow the mirrors downstream of the beam expanding optics to be of a lower specification, with less cooling, and therefore less expensive. Additionally or alternatively, it may allow the downstream mirrors to be nearer to normal incidence. The beam splitting apparatus 20 may comprise a plurality of static extraction mirrors arranged in the path of the beam $B_{FEL}$ which direct radiation from the main beam $B_{FEL}$ along the plurality of branch radiation beams $B_a$-$B_h$. Increasing the size of the main beam $B_{FEL}$ reduces the accuracy with which the mirrors must be located in the beam $B_{FEL}$ path. Therefore, this allows for more accurate splitting of the output beam $B_{FEL}$ by the splitting apparatus 20.

The radiation source SO may further comprise shape altering optics which are arranged to alter the cross sectional shape of the radiation beams received from the free electron laser. The shape altering optics may comprise one or more astigmatic or a-spherical optical elements. The shape altering optics and beam expanding optics may share common optical elements.

A free electron laser comprises an electron source, which is operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic field the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

Figure 3:
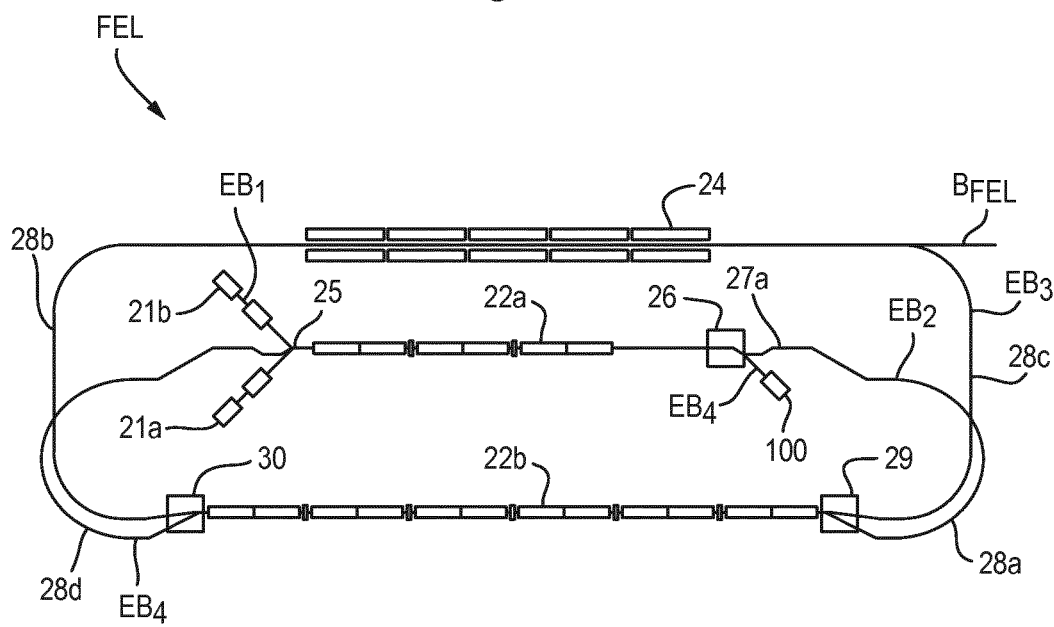
FIG. 3 is a schematic illustration of a free electron laser, which may form part of the lithographic system of FIG. 1.

Referring to FIG. 3, the main components of a free electron laser (FEL) are: injectors 21a, 21b; first and second linear accelerators 22a, 22b; an undulator 24 and a beam dump 100. The injectors 21a, 21b and linear accelerators 22a, 22b are together operable to produce relativistic electrons.

The injectors 21a, 21b (which may also be referred to as injector subsystems) are arranged to produce an initial electron beam $EB_1$ having bunches of electrons with a first energy $E_1$. Two injectors are provided for redundancy, so that one can be serviced while the other is in use, and so it is possible to omit one if desired. The injectors 21a, 21b comprises an electron source such as, for example, a thermionic cathode or photo-cathode and an accelerating electric field. Preferably the initial electron beam $EB_1$ has a relatively low normalised emittance, for example below 1 mm*mRad or below 0.5 mm*mRad. The first energy $E_1$ may be, for example, around 5-20 MeV. The first energy $E_1$ may be around 10-15 MeV, which may be preferable since it may allow the emittance of the initial electron beam $EB_1$ to remain below 1 mm*mRad. An electron beam coupler 25, e.g. a dipole magnet system, couples the initial electron beam $EB_1$ into the first linear accelerator 22a.

The initial electron beam $EB_1$ is accelerated by the first linear accelerator 22a to form an accelerated electron beam $EB_2$. In an example, the first linear accelerator 22a may comprise a plurality of resonant cavities, which are axially spaced along a common axis, and one or more radio frequency power sources, which are operable to control the electromagnetic fields along the common axis as bunches of electrons pass between them so as to accelerate each bunch of electrons. The resonant cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the resonant cavities may be conventionally conducting (i.e. not superconducting) radio frequency cavities and may be formed from, for example, copper. Other types of linear accelerators may also be used.

The accelerated electron beam $EB_2$ then passes through a beam diverter 26, whose function will be explained later, and a first chicane 27a which compensates for the effect of beam diverter 26. The accelerated electron beam $EB_2$ then passes through first arc 28a which changes the beam direction by about 180 degrees and delivers the accelerated electron beam $EB_2$ to second linear accelerator 22b. Second linear accelerator 22b may have a similar construction to first linear accelerator 22a and further accelerates accelerated electron beam $EB_2$ to a second, higher energy $E_2$. The free electron laser comprises two linear accelerators in order to make its overall layout more compact. If desired a single longer linear accelerator can be used in place of the first and second linear accelerators 22a, 22b.

The accelerated electron beam $EB_2$ then passes through second arc 28b, which delivers it to the undulator 24. The undulator 24 comprises a plurality of magnets, which are operable to produce a periodic magnetic field and arranged so as to guide the relativistic electrons produced by the injector 21 and linear accelerator 22 along a periodic path. As a result, the electrons radiate electromagnetic radiation generally in the direction of a central axis of the undulator 24. The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may produce elliptically polarized radiation, which may be preferred for exposure of a substrate W by the lithographic apparatuses LA1-LA8.

The undulator 24 comprises a plurality of sections, each section comprising a periodic magnet structure. The undulator 24 may further comprise a mechanism for refocusing the accelerated electron beam $EB_2$ such as, for example, a quadrupole magnet in between one or more pairs of adjacent sections. The mechanism for refocusing the accelerated electron beam $EB_2$ may reduce the size of the electron bunches, which may improve the coupling between the electrons and the radiation within the undulator 24, increasing the stimulation of emission of radiation.

As electrons move through the undulator 24, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period, $\gamma$ is the Lorentz factor of the electrons and K is the undulator parameter. A is dependent upon the geometry of the undulator 24: for a helical undulator A=1, whereas for a planar undulator A=2. In practice, each bunch of electrons will have a spread of energies although this spread may be minimised as far as possible (by producing an accelerated electron beam $EB_2$ with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through the undulator 24. The free electron laser FEL may operate in self-amplified stimulated emission (SASE) mode. Operation in SASE mode may require a low energy spread of the electron bunches in the accelerated electron beam $EB_2$ before it enters the undulator 24. Alternatively, the free electron laser FEL may comprise a seed radiation source, which may be amplified by stimulated emission within the undulator 24.

Electrons moving through the undulator 24 may cause the amplitude of radiation to increase, i.e. the free electron laser FEL may have a non-zero gain. When the resonance condition of Eq. (1) is satisfied, the gain of the free electron laser FEL may be zero. Maximum gain may be achieved when conditions are close to but slightly off resonance.

The interaction between the electrons and radiation within the undulator 24 produces a spread of energies within the electron bunches in the accelerated electron beam $EB_2$. The electron beam $EB_3$ exiting the undulator 24 may be considered to be a different electron beam with a spread of energies and may be referred to as a used electron beam. The energy spread in the used electron beam $EB_3$ is dependent upon the conversion efficiency of the undulator 24. Quantitatively, the width of the energy spread in the used electron beam $EB_3$ may be given by a product of a conversion efficiency of the undulator 24 and the second energy $E_2$.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator in order to keep bunches of electrons at or close to resonance as they are guided though the undulator 24. Note that the interaction between the electrons and radiation within the undulator 24 produces a spread of energies within the electron bunches. The tapering of the undulator 24 may be arranged to maximise the number of electrons at or close to resonance. For example, the electron bunches may have an energy distribution which peaks at a peak energy and the tapering maybe arranged to keep electrons with this peak energy at or close to resonance as they are guided through the undulator 24. Advantageously, tapering of the undulator has the capacity to significantly increase conversion efficiency. The use of a tapered undulator may increase the conversion efficiency (i.e. the portion of the energy of the accelerated electron beam $EB_2$ which is converted to radiation in the radiation beam $B_{FEL}$) by more than a factor of 2. The tapering of the undulator may be achieved by reducing the undulator parameter K along its length. This may be achieved by matching the undulator period $\lambda_u$ and/or the magnetic field strength $B_0$ along the axis of the undulator to the electron bunch energy to ensure that they are at or close to the resonance condition. Meeting the resonance condition in this manner increases the bandwidth of the emitted radiation.

A beam of radiation $B_{FEL}$ propagates from the undulator 24. The radiation beam $B_{FEL}$ comprises EUV radiation. The beam of EUV radiation $B_{FEL}$ output by the free electron laser FEL may have a substantially circular cross section and a Gaussian intensity profile. The radiation beam produced by an EUV free electron laser typically has a relatively small etendue. In particular, the EUV radiation beam $B_{FEL}$ produced by the free electron laser FEL has a significantly smaller etendue than an EUV radiation beam that would be generated by a laser produced plasma (LPP) source or a discharge produced plasma (DPP) source (both of which are known in the prior art). For example, the radiation beam $B_{FEL}$ produced by the free electron laser FEL may have a divergence less than 500 μrad, for example less than 100 μrad, and may for example have a diameter of around 50 μm as it leaves the undulator 24.

The output power of the free electron laser FEL may be of the order of tens of kilowatts, in order to support high throughput for the eight EUV lithographic apparatus LA1-LA8. At these powers, since the initial diameter of the radiation beam $B_{FEL}$ produced by the free electron laser FEL is so small, the power density of the radiation beams $B_{a-h}$ will be significant.

In order for the output power of the free electron laser FEL to be sufficient to support high throughput for a plurality of EUV lithographic apparatus LA1-LA8, the free electron laser FEL may have certain properties. For example, the second energy $E_2$ of accelerated electron beam $EB_2$ that is output from second linear accelerator 22b may be around 500 to 1000 MeV. The power of the accelerated electron beam $EB_2$ may be of the order of 1 to 100 MW. The power of the accelerated electron beam $EB_2$ may be dictated by a desired power of the output beam of EUV radiation $B_{FEL}$ and the conversion efficiency of the undulator 24. For a given output power of the free electron laser FEL, the higher the conversion efficiency of the undulator 24 is, the lower the current of the injector 21 will be. Higher undulator conversion efficiencies and lower injector currents may be highly desirable.

The used electron beam $EB_3$ leaving the undulator 24 has to be absorbed by a dump 100. The dump 100 may comprise a sufficient quantity of material to absorb the used electron beam $EB_3$. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It is desirable to reduce the energy of electrons in the used electron beam $EB_3$ before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

Before entering the dump 100, energy is extracted from the used electron beam $EB_3$ i.e. the electrons are decelerated. The energy of the electrons may be reduced to below 10 MeV and, preferably, below 5 MeV. Advantageously, electrons below this energy do not induce any significant level of radioactivity in the beam dump 100. During operation of the free electron laser FEL, gamma radiation will be present but when the electron beam E is switched off, the beam dump 100 will be safe to handle.

The electrons leaving the undulator 24 are decelerated using the first and second linear accelerators 22a, 22b. That is, the first and second linear accelerators 22a, 22b that are used to accelerate electrons output from the injector 21 may also be used for deceleration. Such an arrangement is known as an energy recovering LINAC (ERL).

The electron bunches that leave the undulator 24 pass through third arc 28c which brings them to the second linear accelerator 22b with a phase difference of around 180 degrees relative to the radio frequency (RF) field in the second linear accelerator 22b. A combiner 29 combines the used electron beam $EB_3$ with the accelerated electron beam $EB_2$. The used electron beam $EB_3$ is decelerated in the second linear accelerator 22b to form decelerated electron beam $EB_4$.

At the exit of second linear accelerator 22b it is necessary to separate the accelerated electron beam $EB_2$ from the decelerated electron beam $EB_4$. The accelerated electron beam $EB_2$ and the decelerated electron beam $EB_4$ propagate through the second linear accelerator 22b along the same path. A spreader 30 separates the accelerated electron beam $EB_2$ and the decelerated electron beam $EB_4$. The accelerated electron beam $EB_2$ proceeds to second arc 28b whilst the decelerated electron beam $EB_4$ passes through fourth arc 28d to combiner 25 (mentioned above). Combiner 25 combines the decelerated electron beam $EB_4$ with the bunched electron beam $EB_1$ and enters them into the first linear accelerator 22a, with the decelerated electron beam $EB_4$ having a phase difference of around 180 degrees relative to the radio frequency (RF) field in the first linear accelerator 22a. The first linear accelerator 22a therefore further decelerates the decelerated electron beam $EB_4$ by the same mechanism as the second linear accelerator.

At the exit of the first linear accelerator 22a, the decelerated electron beam $EB_4$ is separated from the accelerated electron beam $EB_2$ using a dipole separator 26 so that the decelerated electron beam can be sent to the dump 100 and the accelerated beam $EB_2$ passes to the second linear accelerator via first arc 28a. A dipole separator simply applies a uniform magnetic field across the beam path causing the accelerated and decelerated electron beams to bend. The degree of deflection to the electron beams caused by the dipole separator 26 is dependent upon the energies of the electrons in the respective beams. Thus the accelerated electron beam $EB_2$ is deflected by only a small amount, whilst the decelerated electron beam is deflected by a greater angle and so is soon physically separate from the accelerated electron beam $EB_2$ and can then be further steered into the dump 100 without affecting the accelerated electron beam $EB_2$. Alternatively an achromatic beam separator (also known as an Enge or Pretzel magnet) can be used to separate the decelerated electron beam $EB_4$ from the accelerated electron beam $EB_2$.

The "life" of an electron bunch may therefore be summarised as follows: it is created in one of the injectors 21a, 21b; accelerated by first linear accelerator 22a and again by second linear accelerator 22b; generates radiation in undulator 24; is decelerated by second linear accelerator 22b and again by first linear accelerator 22a; and finally is absorbed in dump 100. In the above, a description of items such as chicanes and stairs that are used to connect parts of the beam path has been omitted for the sake of brevity. An electron beam propagating through the FEL is referred to herein as the upstream electron beam up to and including the undulator and as the downstream electron beam thereafter.

It is highly desirable that the free electron laser provide radiation to the lithographic apparatus LA1-LA8 that meets strict requirements for stability, in particular relating to pulse timing, pulse energy and wavelength. These characteristics of the output beam are affected by many different parts of the free electron laser so that achieving the desired specification is difficult. The present inventors have identified that one factor that affects the center or mean wavelength and the longitudinal phase space (energy spread) of the output beam is the timing of the arrival of bunches of electrons at the first cavity of a booster in the injector subsystem. A conventional injector subsystem 21 is depicted in FIG. 4 of the accompanying drawings.

Injector subsystem 21 comprises a cathode module 200 which has a vacuum chamber 202 enclosing a cathode, e.g. photo-cathode 203. Photo-cathode 203 is connected to a high voltage power supply 100 via a high voltage delivery line 101, which passes through a dielectric feed-through 201 in vacuum chamber 202. Vacuum chamber 202 also functions as the anode and is connected to the high voltage power supply 100 via ground line 102. A laser 110 directs a pulsed laser beam 111 through a window 204 in vacuum chamber 202 onto cathode 203. The pulses of radiation of pulsed laser beam 111 cause photo-cathode 203 to emit bunches of electrons due to the photo-electric effect. The material of the photo-cathode 203 and wavelength of the laser beam 111 are selected accordingly. Photo-cathode 203 is raised to a negative potential, e.g. in the range of 100 to 500 kV, perhaps 300 kV, relative to the vacuum chamber 202 so that the bunches of electrons which are ejected from the photo-cathode by pulses of the laser beam 111 are accelerated away from the photo-cathode.

The bunches of electrons pass down a beam pipe 220, 220 through a bunch compressor 170, comprising a buncher cavity 171, to a RF booster 180. A buncher RF source 120 is connected to the buncher cavity 171 via transmission line 121. Buncher cavity 171 and the RF supply to it are configured so that the bunches of electrons are compressed as they pass through bunch compressor 170. The energy of electrons at the back of a bunch of electrons is increased relative to electrons at the front of a bunch so that the electrons at the back of the bunch catch up. RF booster 180 comprises booster cavities 181, 182 connected via transmission lines 131, 132 to booster RF source 130. RF booster 180 is configured to accelerate bunches of electrons to the first energy $E_1$, e.g. around 10 to 15 MeV. Booster bunch detector 161 and compressor bunch detector 162 measure the times of arrival of bunches of electrons at the entrances to bunch compressor 170 and RF booster 180 respectively. Booster bunch detector 161 and compressor bunch detector 162 can also measure the xy position of the centre of charge of the bunches of electrodes and may operate capacitively. Booster bunch detector 161 and compressor bunch detector 162 are connected to timing controller 160 which works with low level RF system 141, 142 to synchronize and stabilize the phases and amplitudes of the various RF fields inside the cavities of the bunch compressor 170 and RF booster 180 and also synchronize the RF fields with the pulses emitted by laser 110.

Note that in FIG. 4 various other components, such as electron optics for focusing, have been omitted for clarity.

As discussed above, achieving uniform acceleration of the electron bunches in the first linear accelerator 22a and second linear accelerator 22b, as well as the RF booster 180, which is also a form of linear accelerator, requires that the bunches of electrons arrive at the correct phase relationship with the accelerating RF fields. Any variation in the arrival time of bunches of electrodes, which may also be referred to as jitter, affects the amount of energy imparted to the electrons in the bunches which in turn affects the wavelength of the EUV radiation generated by the FEL. Since the frequency of the accelerating RF fields is very high, even very small variations in the arrival time of bunches of electrons can cause an unacceptable variation in wavelength of the output EUV radiation.

The present inventors have determined that a significant cause in variation of the time of arrival of bunches of electrons at the entrance to RF booster 180 is variation in the voltage applied to the photo-cathode 203 by high voltage source 100. The distance between photo-cathode 203 and the entrance to RF booster 180 may be of the order of 1 m. Since the potential difference between photo-cathode 203 and vacuum chamber 202 may be of the order of 100 to 500 kV, the bunches of electrons are not accelerated to relativistic speeds. Therefore any variation in the potential difference between photo-cathode 203 and vacuum chamber 202 will cause a variation in the speed of electron bunches and hence a variation in the time of arrival at the entrance to RF booster 180.

Therefore, it is desirable that high voltage supply 100 provides a highly stable potential difference between photo-cathode 203 and vacuum chamber 202. However, a state of the art high voltage supply can only achieve a peak to peak variation of the order of $10^{-3}$ (i.e. a variation of about 100 volts per 100 kV). The variation in voltage is likely to increase if operation of the beam is not regular. A periodic interruption of the beam, which may be required for other reasons, will therefore lead to a time dependent potential difference between the photo-cathode 203 and vacuum chamber 202 in the time of arrival of electron bunches at the RF booster 180. Accordingly therefore the present inventors have determined that a correction to the time of arrival of electron bunches at the entrance to RF booster 180 is desirable.

FIG. 5 depicts an injector subsystem 21' according to an embodiment of the present invention. Parts of injector subsystem 21' which are the same as in injector subsystem 21' of FIG. 4 are indicated with like references and are not described further for reasons of brevity.

In injector subsystem 21', correction electrode 303 is provided around the path of bunches of electrons from photo-cathode 203 to RF booster 180. Correction electrode 303 is an example of a timing corrector for correcting the timing of bunches of electrodes. Correction electrode 303 is connected to correction voltage source 300 via a dielectric feedthrough 302 which isolates it from vacuum chamber 202. Correction electrode 303 is desirably axially symmetric about the beam path. Correction voltage source 300 is connected via a controller 301 (e.g. a feedback and/or feedforward control system) to the low level RF circuit 141 which synchronizes laser 110 and booster RF source 120, and also measures arrival timing by the booster bunch detector 161 and compressor bunch detector 162 and interface to low level RF system 160.

According to the correction voltage applied to correction electrode 303, it can have the effect of either increasing or reducing the travel time of bunches of electrodes from photo-cathode 203 to RF booster 180. For example, if correction electrode 303 is relatively positive, electrons will be accelerated towards it and speed up. There is no electric field inside correction electrode 303 so that bunches of electrons will propagate through correction electrode 303 at constant speed. At the exit, if correction electrode 303 is relatively positive, electrons will be decelerated to their original speed. Conversely, if the correction electrode 303 is relatively negative, electrons will be decelerated on approach to it, travel through it at constant speed and be accelerated on leaving it. Thus, the net effect of correction electrode 303 is not to change the energy or speed of the electrons but only to change the travel time of bunches of electrons. The magnitude of the effect on the travel time of bunches of electrons depends on the magnitude of the potential difference applied to correction electrode 303 and its length. The longer the correction electrode 303 is the longer the bunches of electrons spend at the increased or reduced speed, and the greater the change in travel time. In an embodiment, correction electrode 303 may have a length of about 50 mm to 300 mm, e.g. 100 mm.

In the embodiment of FIG. 5, the correction electrode 303 is located between photo-electrode 203 and bunch compressor 170. It is therefore possible to correct the time of arrival of the bunches of electrons at bunch compressor 170. It is then expected that the bunches of electrons will travel to RF booster 180 in the correct time.

Figure 6:
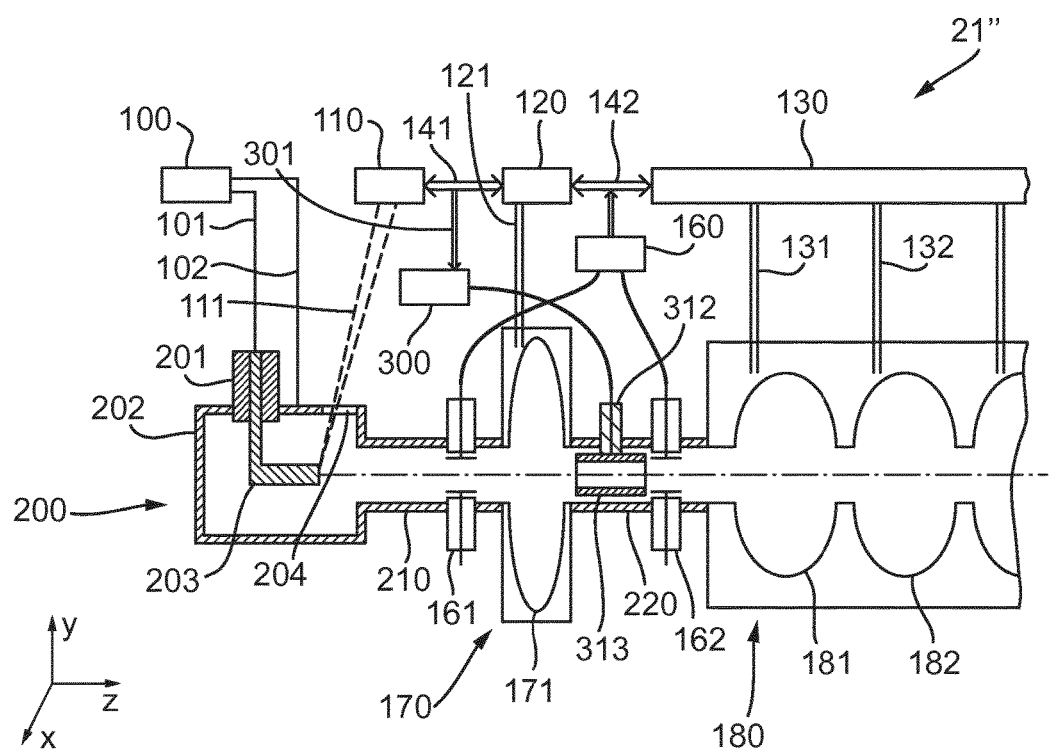
FIG. 6 depicts an injector subsystem of a free electron laser according to an embodiment.

FIG. 6 depicts an alternative arrangement of an injector subsystem 21" according to an embodiment of the invention in which a correction electrode 313 is located between bunch compressor 170 and RF booster 180. Correction electrode 313 is an example of a timing corrector for correcting the timing of bunches of electrodes. Correction electrode 313 can therefore directly affect the time of arrival of bunches of electrons at the entrance to RF booster 180. Correction electrode 313 can therefore additionally be used to compensate for any variation in bunch timing that might be caused by bunch compressor 170 acting on bunches of electrons having different mean energies. In an embodiment of the invention two correction electrodes are provided, one before the bunch compressor 170 and one after the bunch compressor 170 and before the booster. In other configurations of an injector subsystem the one or more correction electrodes may be located wherever appropriate.

Figure 7A:
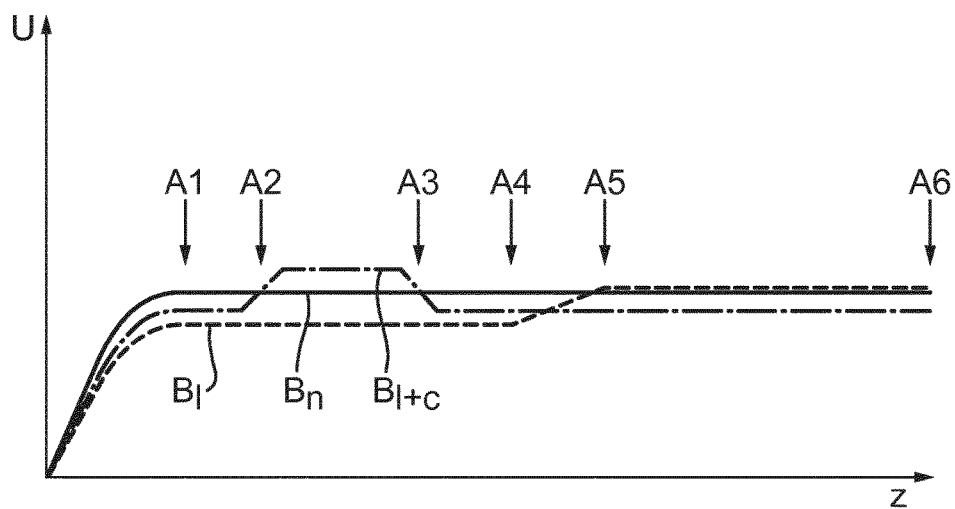
FIG. 7A is a graph of mean bunch energy vs distance.
Figure 7B:
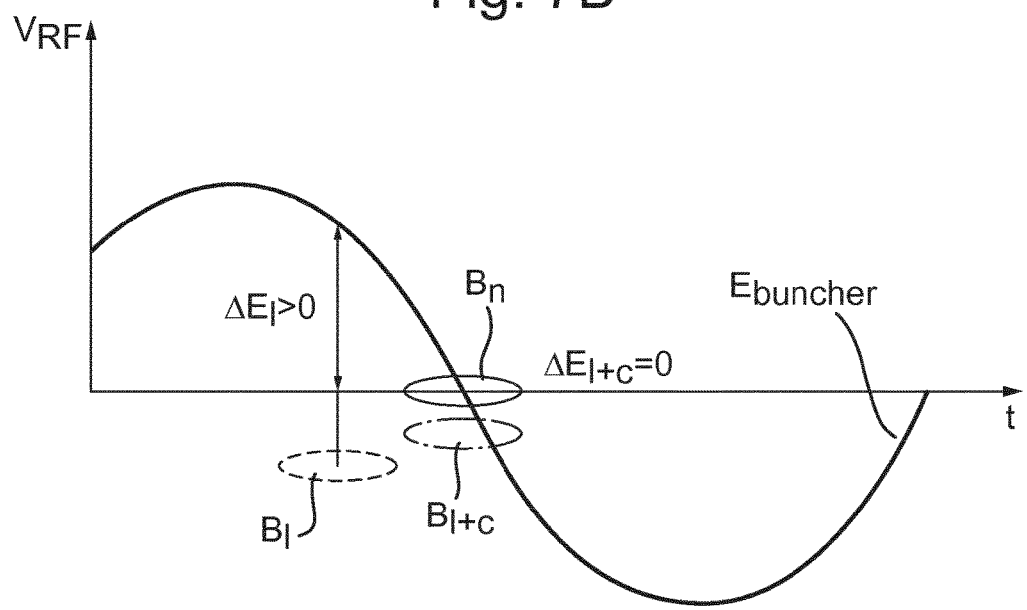
FIG. 7B is a graph of energy gain in a buncher vs time of arrival.

FIGS. 7A and 7B help explain the functioning of an embodiment of the present invention. FIG. 7A is a graph showing the mean energy U of electrons of a bunch of electrons vs distance z from photo-cathode 203. Reference A1 indicates the position of the output of the photo-cathode, A2 the entrance to correction electrode 210, A3 the exit of correction electrode 210, A4 the entrance to bunch compressor 170, A5 the output of bunch compressor 170 and A6 the input to RF booster 180.

FIG. 7B shows the energy gain $V_{RF}$ of bunches in a buncher relative to the nominal arrival time t. The energy gain $V_{RF}$ is sinusoidally related to time of arrival so that bunches of electrons that arrive at the correct phase gain no energy. Bunches of electrons that arrive early lose energy whilst bunches of electrons that arrive late gain energy. $B_n$ indicates a bunch arriving at the nominal arrival time which gains no energy. $B_l$ indicates a bunch that arrives late and gains energy $\Delta E_l$. $B_{l+c}$ indicates a bunch that has an initial lower energy but due to the effect of the correction electrode arrives at the correct timing to the buncher. The energy gain $\Delta E_{l+c}$ of bunch $B_{l+c}$ is zero.

In FIG. 7A, the solid line indicates the nominal bunch which, after the initial acceleration caused by the photo-cathode potential, proceeds through the bunch compressor 170 and RF booster 180 at constant energy. The dashed line indicates a bunch which is given a low initial acceleration by the voltage at the photo-cathode and in the absence of a correction it arrives late at the buncher. The buncher therefore gives it an energy boost causing it to arrive at the booster with a higher energy and at an incorrect timing. Energy gain in the buncher does not make up for the delay that occurs initially. Because the bunch arrives at the booster with incorrect timing, it may, depending on the field phase, gain too much or too little energy resulting in an error which persists through the linear accelerators and results in generation of EUV radiation at the wrong wavelength.

The dot chain line in FIG. 7A indicates a bunch with low energy due to fluctuation in the photo-cathode potential but where a correction is applied via the correction electrode. As can be seen, the correction electrode accelerates the bunch of electrons at its entrance so they travel faster through the correction electrode to make up for the time delay due to the initial lower photo-cathode potential. They are decelerated at the exit of the correction electrode and arrive at the buncher at the correct timing. The corrected bunch of electrons therefore does not gain energy in the buncher. If the delay in travel time from buncher to booster is undesirably high, (i.e. bunches of electrons travel at energy below nominal after the buncher even though their arrival timing at the buncher is correct), a second electrode may be provided. At this stage, the corrected bunch of electrons may have a lower energy than nominal but the acceleration applied by the booster is only weakly dependent on the energy of the bunches at the input side so that the initial energy error becomes negligible after acceleration of the bunches in the booster.

Figure 8:
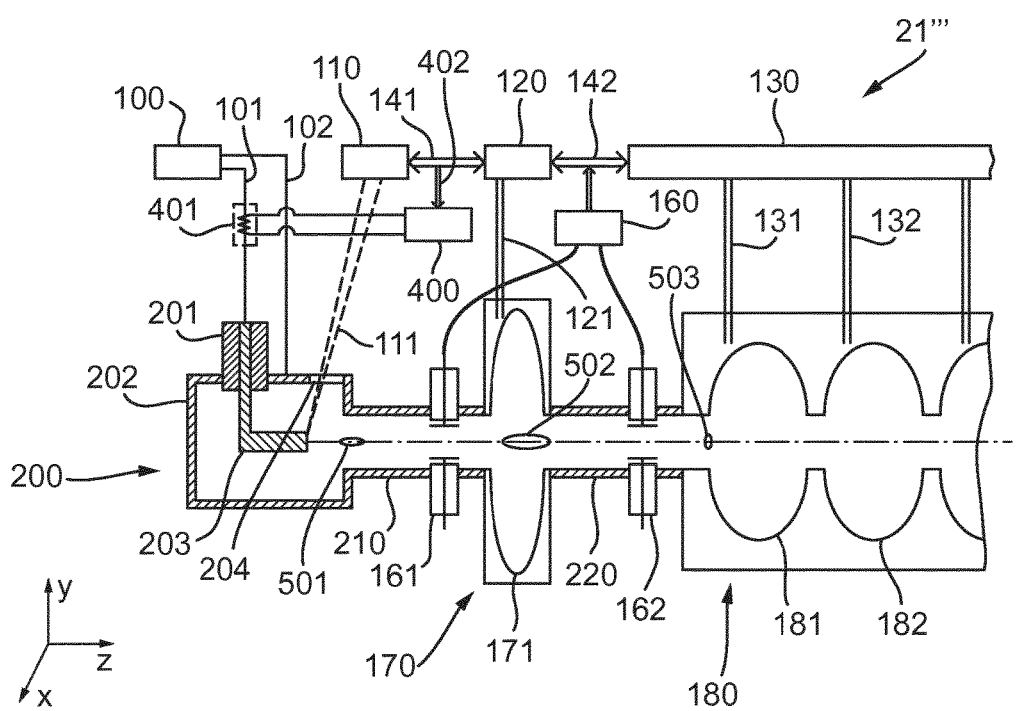
FIG. 8 depicts an injector subsystem of a free electron laser according to an embodiment.

FIG. 8 depicts an injector subsystem 21''' according to another embodiment of the present invention.

In the embodiment of FIG. 8, a timing corrector comprises an ungrounded transformer 401 and a correction voltage supply 400. Correction voltage supply 400 is connected to the low level RF-system 141 that synchronizes laser 110 and RF supply 120 and provided with signals from booster bunch detector 161 and compressor bunch detector 162. A feedforward and/or feedback control arrangement based on these inputs determines a correction voltage to be applied via ungrounded transformer 401 to the high voltage supply line 101. In this way, the potential of the photo-cathode can be corrected so that bunches of electrons 501 are emitted with the correct energy. Bunches 502 arriving at bunch compressor 170 have the correct timing as do bunches 503 arriving at RF booster 180.

Although the described embodiment of lithographic system LS comprises eight lithographic apparatuses LA1-LA8, a lithographic system according to an embodiment of the invention may comprise any number of lithographic apparatuses.

A lithographic system according to an embodiment of the invention may further comprise one or more mask inspection apparatuses. The beam splitting apparatus 20 may direct a portion of the main radiation beam $B_{FEL}$ to the mask inspection apparatus. The mask inspection apparatus may use this radiation to illuminate a mask and uses an imaging sensor to monitor radiation reflected from the mask MA. The mask inspection apparatus may include optics (e.g. mirrors) configured to receive a branch radiation beam from beam splitting apparatus 20 and direct the radiation beam at a mask. The mask inspection apparatus may further include optics (e.g. mirrors) configured to collect radiation reflected from the mask and form an image of the mask at the imaging sensor. The mask inspection apparatus may be similar to the lithographic apparatus LA1 shown in FIG. 2, with the substrate table WT replaced with an imaging sensor. In some embodiments, the lithographic system may comprise two mask inspection apparatuses to allow for some redundancy.

This may allow one mask inspection apparatus to be used when the other mask inspection apparatus is being repaired or undergoing maintenance. Thus, one mask inspection apparatus is always available for use. A mask inspection apparatus may use a lower power radiation beam than a lithographic apparatus.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm. The present invention can also be applied in a free electron laser that is used to generate radiation outside the EUV wavelength range.

The lithographic apparatuses LA1-LA8 may be used in the manufacture of ICs. Alternatively, the lithographic apparatuses LA1-LA8 described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An electron source comprising:
   a cathode configured to be connected to a negative potential;
   a laser configured to direct pulses of radiation onto the cathode so as to cause the cathode to emit bunches of electrons;
   an RF booster connected to an RF source and configured to accelerate the bunches of electrons; and
   a timing corrector configured to correct a time of arrival of bunches of electrons at the RF booster relative to an RF voltage provided by the RF source,
   wherein the timing corrector comprises a correction electrode surrounding a path of the bunches of electrons from the cathode to the RF booster and a correction voltage source configured to apply a correction voltage to the correction electrode.

2. The electron source of claim 1, further comprising:
   a booster bunch detector configured to detect the arrival of the bunch of electrons at the RF booster,
   wherein the timing corrector is responsive to the booster bunch detector.

3. The electron source of claim 1, further comprising:
   a bunch compressor configured to longitudinally compress the bunches of electrons between the cathode and the RF booster; and
   a compressor bunch detector configured to detect the arrival of the bunch of electrons at the bunch compressor,
   wherein the timing corrector is responsive to the compressor bunch detector.

4. The electron source of claim 3, wherein the correction electrode is between the cathode and the bunch compressor.

5. The electron source of claim 3, wherein the correction electrode is between the bunch compressor and the RF booster.

6. The electron source of claim 3, further comprising another correction electrode, wherein the correction electrode is between the cathode and the bunch compressor and the another correction electrode is between the bunch compressor and the RF booster.

7. The electron source of claim 3, wherein the correction electrode is rotationally symmetric about a path.

8. The electron source of claim 7, wherein the correction electrode is cylindrical.

9. The electron source of claim 7, wherein a length of the correction electrode is in the range of from about 5 to about 20 percent of a distance between the cathode and the RF booster.

10. The electron source of claim 7, wherein a distance between the booster bunch detector and/or the compressor bunch detector and a closest end of the correction electrode is greater than twice a diameter of the correction electrode.

11. The electron source of claim 8, wherein the timing corrector further comprises a controller configured to correct a time of the arrival of the bunches of electrons at the bunch compressor based on a phase of the RF voltage and a timing of the pulses of radiation.

12. The electron source of claim 1, wherein the timing corrector comprises a correction voltage source connected to the cathode via an ungrounded transformer.

13. The electron source of claim 1, wherein the timing corrector further comprises a controller configured to correct a time of the arrival of the bunches of electrons at the RF booster based on a phase of the RF voltage and timing of the pulses of radiation.

14. The electron source of claim 11, wherein the controller is a feedback control system.

15. The electron source of claim 11, wherein the controller is a feedforward control system.

16. A free electron laser comprising:
   an electron source comprising:
      a cathode configured to be connected to a negative potential;
      a laser configured to direct pulses of radiation onto the cathode so as to cause the cathode to emit bunches of electrons;
      an RF booster connected to an RF source and configured to accelerate the bunches of electrons; and
      a timing corrector configured to correct a time of arrival of bunches of electrons at the RF booster relative to an RF voltage provided by the RF source,
      wherein the timing corrector comprises a correction electrode surrounding a path of the bunches of electrons from the cathode to the RF booster and a correction voltage source configured to apply a correction voltage to the correction electrode.

17. A lithographic system comprising:
   a free electron laser of claim 16; and
   one or more lithographic apparatuses.

* * * * *